United States Patent
Hsieh et al.

(10) Patent No.: US 7,553,755 B2
(45) Date of Patent: Jun. 30, 2009

(54) METHOD FOR SYMMETRIC DEPOSITION OF METAL LAYER

(75) Inventors: Sheng-Hui Hsieh, Taipei (TW); Ling-Wuu Yang, Hsinchu (TW); Chi-Tung Huang, Hsinchu (TW); Kuang-Chao Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 24 days.

(21) Appl. No.: 11/334,610

(22) Filed: Jan. 18, 2006

(65) Prior Publication Data

US 2007/0167007 A1    Jul. 19, 2007

(51) Int. Cl.
H01L 21/4763    (2006.01)

(52) U.S. Cl. ............. 438/622; 438/620; 438/618; 438/E23.146

(58) Field of Classification Search ......... 257/758, 257/E23.144, E23.145, E23.146, 797; 438/618–624, 438/626, 627, 637–638, 639, 681, 653, 672–673, 438/700
See application file for complete search history.

(56) References Cited

U.S. PATENT DOCUMENTS

| | | | | |
|---|---|---|---|---|
| 6,066,569 | A * | 5/2000 | Tobben | 438/717 |
| 6,365,502 | B1 * | 4/2002 | Paranjpe et al. | 438/622 |
| 6,368,954 | B1 * | 4/2002 | Lopatin et al. | 438/627 |
| 6,468,907 | B2 * | 10/2002 | Pyo | 438/687 |
| 6,531,327 | B2 * | 3/2003 | Kanamaru et al. | 438/17 |
| 2002/0025690 | A1 * | 2/2002 | Kawahara et al. | 438/780 |
| 2002/0102838 | A1 * | 8/2002 | Paranjpe et al. | 438/622 |
| 2005/0006761 | A1 * | 1/2005 | Chen | 257/734 |

OTHER PUBLICATIONS

Dae-Joung Kim, et al., "Wafer Induced Reading Error in Metal Sputtering Process", pp. 667-671, Proceedings of SPIE vol. 4344.
Christopher J. Gould, Yuanting Cui, Sean Louks; Advanced Process Control Applied to Metal Layer Overlay Process; "Infineon Technologies, 6000 Technology Blvd., Sandston, VA 23150"; Data Analysis and Modeling for Process Control; edited by Kenneth W. Tobin, Jr.; SPIE vol. 5378 (SPIE, Bellingham, WA, 2004).
Se-Jin Park, Hong-Lae Kim, Yong-Suk Lee, Weon-Sik Yang; CMP and Self-Shadowing Effect of Overlay Mark in Metal Sputtering Process; "Dongbu Electronics Co., 474-1 Sangwoo-ri, Kamgok-myun, Umsung-kun, Chungbuk, 369-852, Korea"; Metrology, Inspection and Process Control for Microlithography XVII, Daniel J. Herr, Editor; Proceedings of SPIE vol. 5038 (2003).
Wenzhan Zhou, Zhiqiang Li, Luke Ng, Teng Hwee Ng, Hui Kow Lim; "Fab3, Mask Module, Chartered Semiconductor Mfg. Ltd., 60 Woodlands Industrial Park D, St. 2, Singapore 738406"; Metrology, Inspection and Process Control for Microlithography XVII, Daniel J. Herr, Editor; Proceedings of SPIE vol. 5038 (2003).

* cited by examiner

*Primary Examiner*—Dung A. Le
(74) *Attorney, Agent, or Firm*—Baker & McKenzie LLP

(57) ABSTRACT

A method for symmetric deposition of metal layer over a metal layer registration key comprises using MOCVD to form the metal layer. Once the symmetric metal layer is formed, a metal layer registration key can be accurately detected and the metal layer registration key overlay shift can be improved.

18 Claims, 6 Drawing Sheets

METHOD FOR SYMMETRIC DEPOSITION OF METAL LAYER

BACKGROUND

1. Field of the Invention

The invention relates generally to the fabrication of metal layers for semiconductor devices and more particularly to the deposition of metal layers that overcome asymmetric metal deposition problems.

2. Background of the Invention

Metal layers and interconnects are important technologies in semiconductor manufacturing. Interconnects electrically connect different conductor wiring layers in a semiconductor chip. The conductive layers can be layers formed on a substrate surface or over metal wiring layers. It is important that these interconnects, vias, and conductive wiring layers be reliable, be as small as possible for miniaturization of the circuit, and have wide process windows for high yield.

Conventionally, metal layers are often deposited via a sputtering process known as physical vapor deposition (PVD). The term PVD denotes a deposition processes where the coating material is evaporated by various mechanisms, such as resistant heating, high energy ionized gas bombardment, or an electronic gun, under vacuum, and the vapor phase is transported to the substrate forming a coating. PVD is a line of site process in which atoms travel from a metallic source to the substrate on a generally straight path. A conventional PVD coating process normally takes place between temperatures of 100-600° C.

Unfortunately, the metal sputtering process can result in asymmetric deposition of the metal across the wafer.

The alignment and measurement target for a first metal, or metal one layer is structurally defined as the conformance of sputtered metal deposited over predefined, tungsten filled contacts. The predefined tungsten filled contacts can be refereed to as a metal layer registration key. The growth of metal, e.g., AlCu, Ti, TiN, etc., on the wafer surface is not, however, actually expected to be perpendicular. The direction of metal growth is actually expected to be a function of the position on the metal target and the emission angle between the position of the target and the wafer surface. From this, the spatial resultant of metal growth on the wafer surface is expected at both the translation and rotational component. As a result, conventional metal deposition processes show asymmetric deposition, especially at the wafer edge. This results in alignment read errors, because the registration key cannot be accurately detected. Such read errors are generally more pronounced at the edge of the wafer.

The read errors will affect the ML1 overlay shift and as device dimensions shrink the effect will become more serious.

SUMMARY

A method for symmetric deposition of metal layer over a metal layer registration key comprises using MOCVD to form the metal layer. Once the symmetric metal layer is formed, a metal layer registration key can be accurately detected and the metal layer registration key overlay shift can be improved.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1:
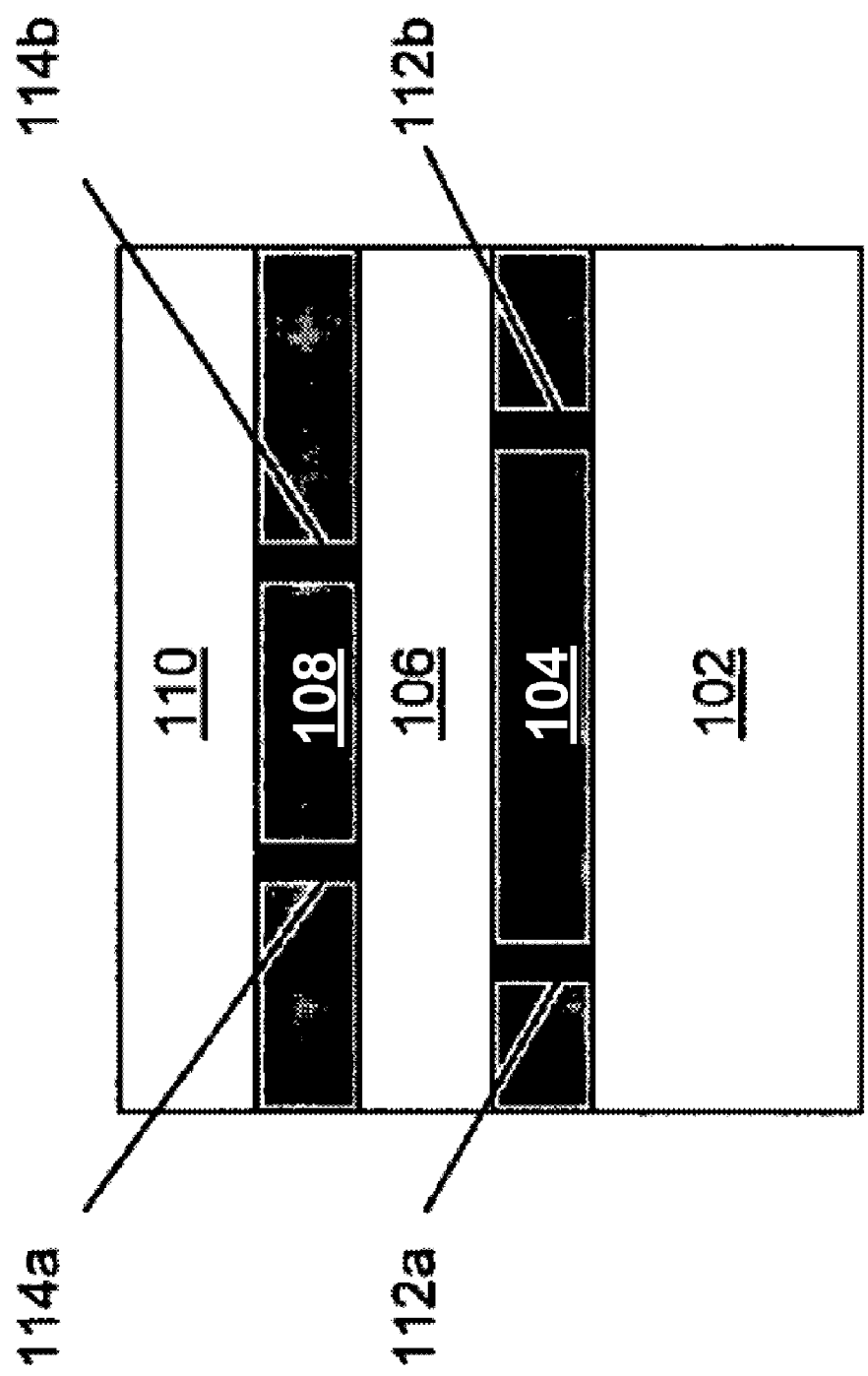
FIG. 1 is a diagram illustrating a metal stack for a conventional semiconductor device.

FIG. 1 is a diagram illustrating a metal stack structure for a semiconductor device. The metal stack comprises a semiconductor structure 102, which can for example comprise a silicon substrate with devices, such as source and drain regions, formed in and over the substrate. Semiconductor structure 102 can also comprise a conductive layer formed over the substrate and pattern layers, such as gate electrodes and word lines. A dielectric layer 104 can then be grown on semiconductor structure 102. A first metal layer 106 can then be deposited on dielectric layer 104. The first metal layer can be referred to as the ML1 layer 106.

A second dielectric layer 108 can then be grown on ML1 106. A second metal layer (ML2) 110 can then be deposited on dielectric layer 108. It will be understood that further dielectric and metal layers can be grown and deposit as required. Further, it will be understood that other layers can be included between the layers illustrated in FIG. 1. Thus, the layers illustrated in FIG. 1 are by way of example only and should not be seen as limiting the structures described herein to any particular layers or layer structure.

Various interconnecting structures, such as vias or contacts, are used to connect metal layers 106 and 110 with each other and with devices on semiconductor structure 102. For example, as illustrated in FIG. 1, contacts 112*a* and 112*b* can extend from ML1 106 through dielectric 104 to semiconductor structure 102.

Further, a pattern of contacts is used for alignment purpose. The pattern can be referred to as a metal layer registration key. Thus, metal layers 106 and 110 are deposited over a pattern intended to ensure alignment for subsequent processes. For example, after ML1 106 is deposited, a ML1 registration key is used to define a pattern of photoresist that is used to form metal structures in ML1 layer 106. The ML1 registration key overlay is aligned over ML1 layer 106 using the contacts in the ML1 registration key. If ML1 106 metal is misaligned during the deposition process, then it will cause a ML1 registration key overlay shift.

An optical overlay reading machine is often used to detect whether or not the metal deposition has been misaligned, and if so the degree of misalignment.

As mentioned above, the alignment and measurement target for, e.g., ML1 106 is structurally defined as the conformance of sputtered metal deposited over predefined, tungsten filled contacts. The growth of metal, e.g., AlCu, Ti, TiN, etc., on the wafer surface is not, however, actually expected to be perpendicular. The direction of metal growth is actually expected to be a function of the position on the metal target and the emission angle between the position of the target and the wafer surface. From this, the spatial resultant of metal growth on the wafer surface is expected at both the translation and rotational component. As a result, conventional metal deposition processes show asymmetric deposition, especially at the wafer edge. This results in alignment read errors. Such read errors are generally more pronounced at the edge of the wafer.

The read errors will affect the ML1 overlay shift and as devices shrink the effect will become more serious.

The processes described herein substitute a Metal Organic Chemical Vapor Deposition (MOCVD) process for depositing the ML1 layer. For example, instead of using PVD sputtering of Ti or TiN, MOCVD of TiN can be used to improve the ML1 registration key alignment.

Figure 2:
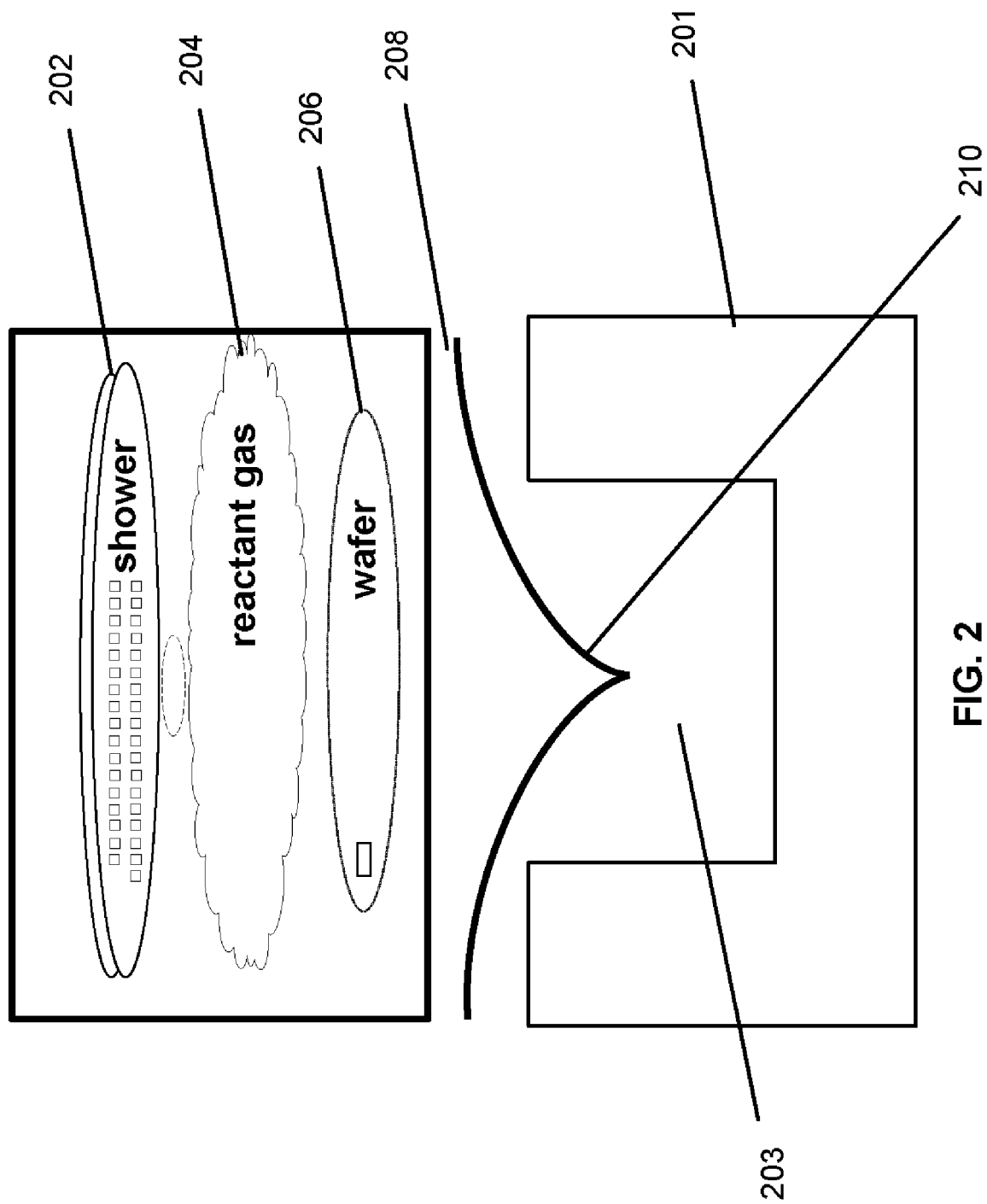
FIG. 2 is a diagram illustrating a metal deposition process in accordance with one embodiment.

FIG. 2 is a diagram illustrating the MOCVD process used to deposit the ML1 metal. In FIG. 2, a contact hole 203 is formed within layer 201. ML1 metal is then deposited using an MOCVD process. In the MOCVD process, a shower of target material 202 is subjected to a reacting gas 204. This will result in a thin film 208 over substrate 201.

An MOCVD of TiN process can take place between temperatures of about 300° C. and 600° C.

As can be seen, there will be a depression 210 in film 208 over contact hole 203. Depression 210 should be at about the center of contact hole 203 for proper alignment.

Figure 4:
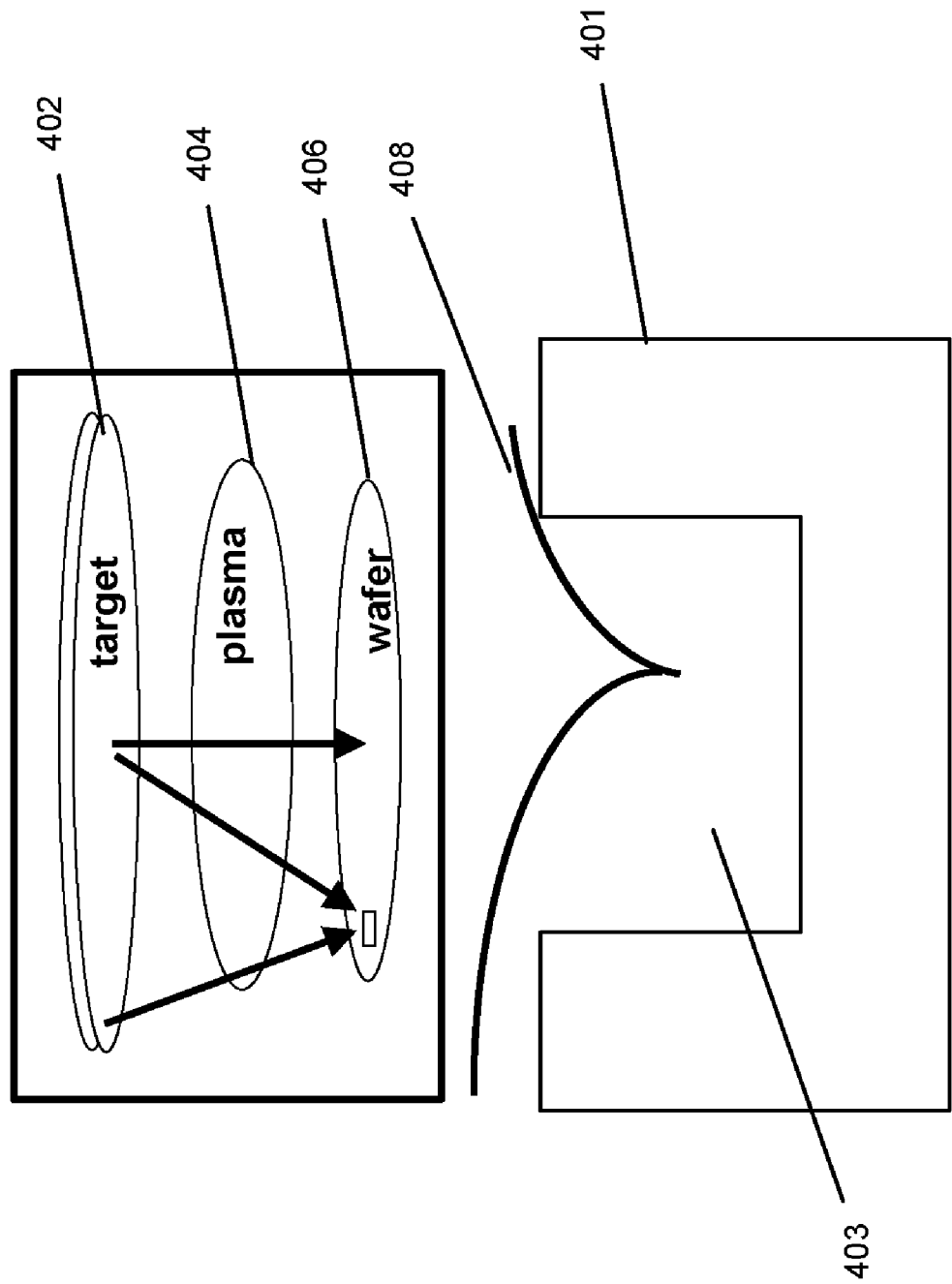
FIG. 4 is a diagram illustrating a conventional metal sputtering process.

FIG. 4 is a diagram of a conventional sputtering process. Here, a target material 402 is subjected to a plasma 404 which forms a film 408 on wafer 406; however, due to the problems described above, film 408 will be misaligned over contact hole 403 in substrate 401. The misalignment will cause ML1 registration key overlay shift. It has been shown that this misalignment becomes larger towards the edge of wafer 406. Further, studies have shown that contact hole sizes smaller than above 0.9 µm can be completely undetectable.

This misalignment results in what is termed "read errors". The read errors are produced by the overlay reading machine. The overlay reading machine is used to detect the alignment of the ML1 registration key, which is used to define a photo resist overlay pattern. The photo resist pattern is used to define structures on the ML1 layer which will be formed during subsequent etching steps.

Figure 3:
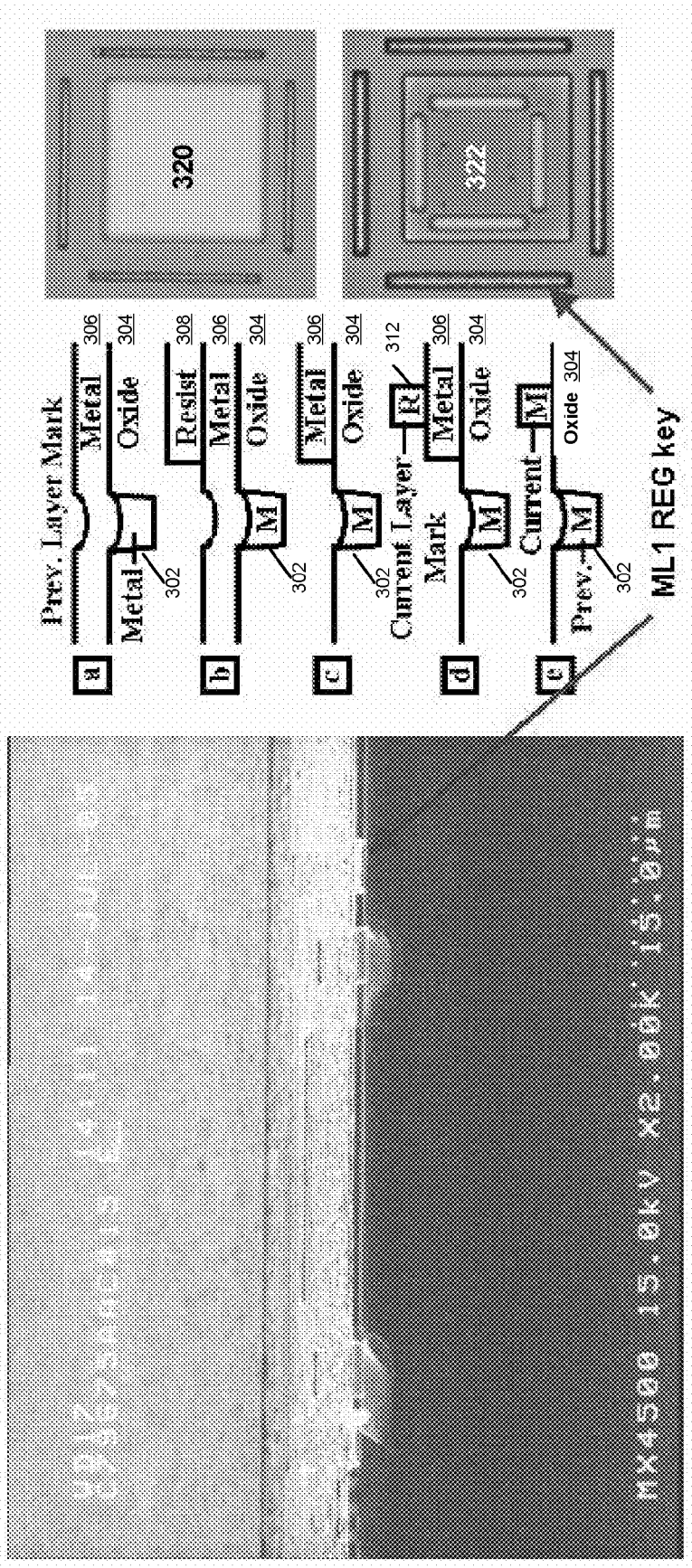
FIG. 3 is a diagram illustrating a process for forming metal structures in a metal layer that includes the process of FIG. 2.

FIG. 3 is a diagram illustrating a process for forming metal structures in the ML1 layer. First, in step (a), an oxide layer 304 with a contact hole 302 that is part of a metal layer registration key 320 formed therein is presented. Metal layer 306 can then be deposited over oxide layer 304. In step (b), photo resist layer 308 is patterned on metal layer 306 using a ML1 registration key overlay. The ML1 registration key overlay is aligned on metal layer 306 using an overlay reading machine which detects, e.g., the center of hole 302. Thus, if metal layer 306 is misaligned over hole 302, as in the example of FIG. 4, then the ML1 registration key overlay will not be properly aligned over metal layer 306.

In step (c), metal layer 306 has been etched away and photo resist 308 has been removed leaving metal structure 310. In step (d), photo resist 312 is layered over metal structure 310 using a second ML1 registration key overlay that is aligned using holes that form a ML1 registration key 322. Again, second ML1 registration key overlay must be aligned with the holes that form part of ML1 registration key 322. Thus, if metal layer 306 is misaligned over the holes, then the second ML1 registration key overlay will not be properly aligned.

In step (e), metal layer 306 is etched away again and photo resist 312 is removed leaving metal structure 314.

Figure 5:
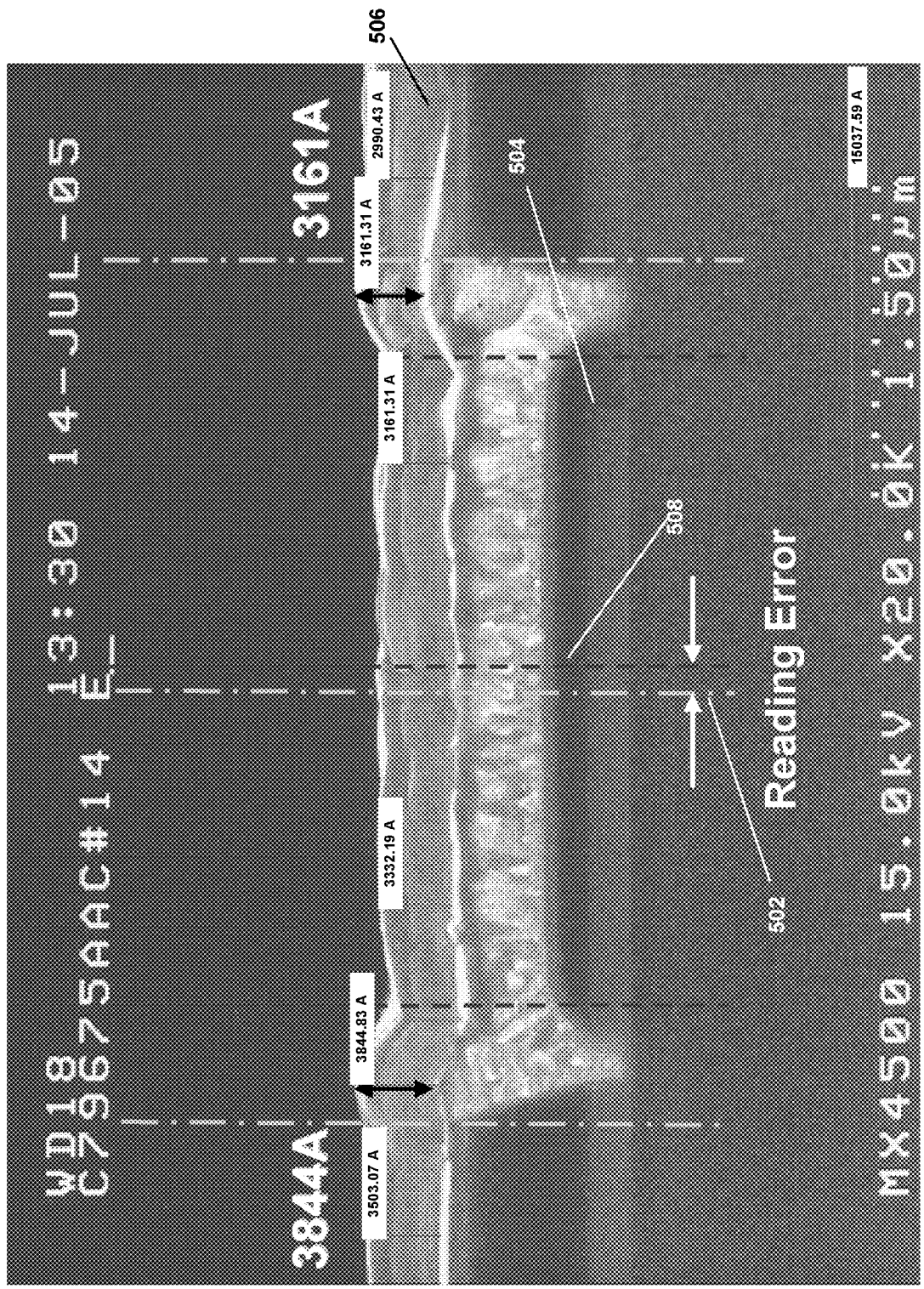
FIG. 5 is a diagram illustrating a SEM profile for a conventional metal deposition process.

FIG. 5 is a diagram illustrating the read error that can result from a conventional deposition process at the edge of the wafer. In FIG. 5, the center mark 502 for hole 504 is illustrated. The overlay machine looks for the center mark. In the example of FIG. 5, the actual center of metal layer 506 is offset over hole 504. This produces a read error of ($\Delta$).

Figure 6:
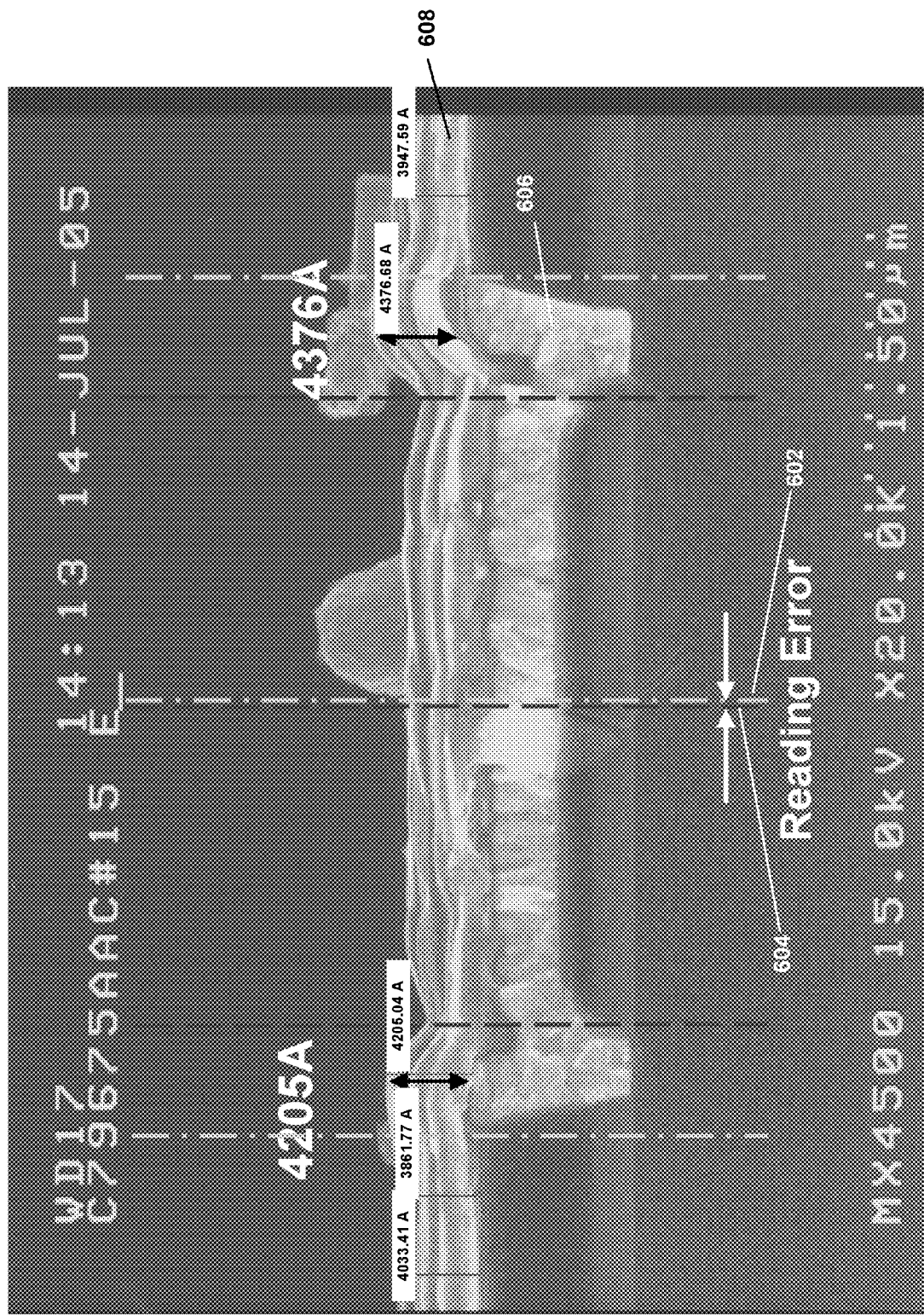
FIG. 6 is a SEM profile for the process of FIG. 2.

FIG. 6 is a diagram illustrating the read error for the deposition process of FIG. 2 at the edge of the wafer. As can be seen, the center mark 602 is offset from the center of the metal 604 by a relatively small error of ($\Delta'$).

Accordingly, the ML1 registration key overlay shift can be improved significantly which can improve the overlay performance at the edge of the wafer on the ML1 layer. As a result, smaller devices and smaller device geometries can be fabricated more efficiently and effectively. The process of FIG. 2 can be used in any BEOL process.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for fabricating a semiconductor device, comprising:
    forming a semiconductor structure;
    forming a metal layer registration key over the semiconductor structure, wherein the metal layer registration key spacing is in the order of a micron; and
    using MOCVD to deposit a symmetric metal layer over the entire metal layer registration key.

2. The method of claim 1, further comprising detecting the metal layer registration key after the symmetric metal layer is deposited.

3. The method of claim 2, further comprising aligning a first metal layer registration key overlay using the detected metal layer registration key.

4. The method of claim 3, patterning a first photo resist layer using the first metal layer registration key overlay and further comprising etching the symmetric metal layer.

5. The method of claim 4, further comprising removing the first photoresist layer.

6. The method of claim 5, further comprising aligning a second metal layer registration key overlay using the detected metal layer registration key.

7. The method of claim 6, patterning a second photo resist layer using the second metal layer registration key overlay and further comprising etching the symmetric metal layer.

8. The method of claim 7, further comprising removing the second photoresist layer.

9. The method of claim 1, wherein the symmetric metal layer is a TiN metal layer.

10. A method for fabricating a semiconductor device, comprising:
    forming a semiconductor structure;
    forming a metal layer registration key over the semiconductor structure, wherein the metal layer registration key spacing is in the order of a micron; and
    using MOCVD to deposit a symmetric metal layer over the entire metal layer registration key,
    wherein the symmetric metal layer includes a groove that is substantially centered over a center point of a contact hole that is part of the metal layer registration key.

11. The method of claim 10, further comprising detecting the metal layer registration key after the symmetric metal layer is deposited.

12. The method of claim 11, further comprising aligning a first metal layer registration key overlay using the detected metal layer registration key.

13. The method of claim 12, patterning a first photo resist layer using the first metal layer registration key overlay and further comprising etching the symmetric metal layer.

14. The method of claim 13, further comprising removing the first photoresist layer.

15. The method of claim 14, further comprising aligning a second metal layer registration key overlay using the detected metal layer registration key.

16. The method of claim 15, patterning a second photo resist layer using the second metal layer registration key overlay and further comprising etching the symmetric metal layer.

17. The method of claim 16, further comprising removing the second photoresist layer.

18. The method of claim 10, wherein the symmetric metal layer is a TiN metal layer.

* * * * *